United States Patent [19]

Longbrake et al.

[11] Patent Number: 5,442,327
[45] Date of Patent: Aug. 15, 1995

[54] MMIC TUNABLE BIPHASE MODULATOR

[75] Inventors: Beth A. Longbrake, Cave Creek; Hugh R. Malone, Phoenix; Michael Dydyk, Scottsdale, all of Ariz.

[73] Assignee: Motorola, Inc., Schaumburg, Ill.

[21] Appl. No.: 263,324

[22] Filed: Jun. 21, 1994

[51] Int. Cl.$^6$ .................................. H04L 27/20
[52] U.S. Cl. ................... 332/103; 332/105; 332/144; 332/146
[58] Field of Search ............... 332/103, 104, 105, 144, 332/146; 329/304, 305; 375/52, 55, 62, 67, 68

[56] References Cited

U.S. PATENT DOCUMENTS

| H 954 | 8/1991 | Lang et al. | 333/164 |
|---|---|---|---|
| 3,484,724 | 12/1969 | Podell | 333/10 |
| 3,781,718 | 12/1973 | Gittinger | 333/11 |
| 4,398,161 | 8/1983 | Lamb et al. | 333/156 |
| 4,524,336 | 6/1985 | Franke | 332/16 R |
| 4,556,856 | 12/1985 | Presser | 333/124 |
| 4,612,520 | 9/1986 | Boire et al. | 333/156 |
| 4,638,190 | 1/1987 | Hwang et al. | 307/512 |
| 4,994,773 | 2/1991 | Chen et al. | 333/164 |
| 5,081,432 | 1/1992 | Devlin et al. | 323/103 |
| 5,166,648 | 11/1992 | Wen et al. | 333/139 |
| 5,175,517 | 12/1992 | Dydyk et al. | 333/118 |
| 5,180,998 | 1/1993 | Wilems | 333/164 |

FOREIGN PATENT DOCUMENTS 57-68917 4/1982 Japan.
63-43412 2/1988 Japan.

OTHER PUBLICATIONS

"A Lumped Element Rat Race Coupler" from Applied Microwave, by Samuel J. Parisi, MITRE Corp., Bedford, Massachusetts, Aug./Sep. 1989.
"A Monolithic Image-Rejection Mixer On GaAS Using Lumped Elements" by John Putnam and Richard Puente, M/A-Com Advanced Semiconductor Operations, Lowell, Mass., from Microwave Journel, Nov. 1987.

Primary Examiner—Robert J. Pascal
Assistant Examiner—David Vu
Attorney, Agent, or Firm—Frederick M. Fliegel

[57] ABSTRACT

An apparatus for providing electronically tunable biphase modulation including an input and a first switch having a first output, a second output and a first input coupled to the input. The first switch couples the first input to either the first output or to the second output in response to a modulating signal. The apparatus also includes a first signal path having a first phase shift and a second signal path having a second phase shift different than the first phase shift. The first signal path is coupled to the first output and the second signal path is coupled to the second output. The apparatus also includes a second switch having a first input coupled to the first signal path, a second input coupled to the second signal path and a terminal output.

20 Claims, 2 Drawing Sheets

MMIC TUNABLE BIPHASE MODULATOR

CROSS-REFERENCE TO RELATED APPLICATIONS

This application is related to co-pending U.S. patent application Ser. No. 08/263,226 filed concurrently herewith, which are assigned to the same assignee as the present application.

FIELD OF THE INVENTION

This invention relates in general to the field of biphase modulators, more specifically to biphase modulators having adjustable phase shifts and more particularly to biphase modulators having close amplitude balance between the two output modulation states.

BACKGROUND OF THE INVENTION

Biphase modulation is important for many electronic products which require digital coding of radio frequency signals, for example, PN coded signals. This type of modulation is often required together with small size, low power draw and robust operation in a broad variety of environments. Examples of such applications include munitions fuzes, radar apparatus and communications systems.

Conventional biphase modulators suffer from lack of flexibility in choosing modulation angles and are typically restricted to 0° and 180° modulation angles. Multiphase modulation schema (e.g., QAM) typically provide phase angles of integer submultiples of 180° (e.g., 45°, 90° etc.). It has been especially uneconomical and impractical to provide close amplitude balance over significant bandwidths between signal portions having different modulation angles, particularly when modulation angles other than submultiples of 180° are required.

Thus, what is needed is a practical, economical apparatus and accompanying method for providing biphase modulation of signals with adjustable phase angles, particularly combined with close amplitude tracking between the two phase states of the modulator, in compact form having low power dissipation and providing robust performance over a broad range of operating conditions.

SUMMARY OF THE INVENTION

An apparatus for providing electronically tunable biphase modulation includes an input and a first switch. The first switch includes a first input coupled to the input, a first output and a second output. The first switch couples the first input to either the first output or to the second output in response to a modulating signal. The apparatus includes a first signal path including a first phase shift. The first signal path is coupled to the first output. The apparatus also includes a second signal path including a second phase shift different than the first phase shift. The second signal path is coupled to the second output. The apparatus further includes a second switch, including a first input coupled to the first signal path, a second input coupled to the second signal path and a terminal output. The second switch couples the first signal path to the terminal output when the first switch couples the input to the first signal path and couples the second signal path to the terminal output when the first switch couples the input to the second signal path.

The first signal path desirably but not essentially comprises a first coupler including first, second, third and fourth ports. The first port is coupled to the first output of the first switch, the second port is coupled to a first reactance element, the third port is coupled to the first input of the second switch and the fourth port is coupled to a second reactance element.

The second signal path desirably but not essentially comprises a second coupler including first, second, third and fourth ports. The first port of the second coupler is coupled to the second output of the first switch, the second port of the second coupler is coupled to a third reactance element, the third port of the second coupler is coupled to the second input of the second switch and the fourth port of the second coupler is coupled to a fourth reactance element.

A first phase shift between the third and fourth ports of the first and second couplers is usefully three times a first phase shift between any two other adjacent ports. The first phase shift is desirably ninety degrees.

The first coupler desirably but not essentially comprises a first capacitor including a first lead coupled to the first port and a second lead coupled to the fourth port, a second capacitor including a first lead coupled to the first port and a second lead coupled to the second port, a first inductor including a first lead coupled to the third port and a second lead coupled to the fourth port, a third capacitor including a first lead coupled to the second port and a second lead coupled to the third port, a second inductor including a first lead coupled to the first port and a second lead coupled to ground and a third inductor including a first lead coupled to the second port and a second lead coupled to ground.

The first, second, third and fourth reactance elements preferably include reactances responsive to low frequency control signals. The first, second, third and fourth reactance elements desirably each comprise varactor diodes including reactances responsive to low frequency control signals.

The first reactance element desirably but not essentially includes a phase shifter providing ninety degrees of phase shift between a first terminal and a second terminal, the first terminal coupled to the fourth port of the first coupler and a varactor diode including a reactance responsive to low frequency control signals, the varactor diode including a first lead coupled to the second terminal and a second lead coupled to ground.

The apparatus desirably but not essentially comprises a monolithic microwave integrated circuit.

The first and second switches are usefully electronic switches operating in response to a modulation signal. The first switch desirably comprises a pair of series-shunt-shunt switches each including a signal input, a pair of complementary control inputs and an output. The inputs of the pair of series-shunt-shunt switches are coupled to the input, an output of a first switch of the pair is coupled to the first signal path and an output of a second switch of the pair is coupled to the second signal path.

Each of the pair of series-shunt-shunt switches desirably but not essentially comprises a series transistor including a gate coupled to one of the complementary control inputs and a source coupled to the input, a first shunt transistor including a gate coupled to another of the complementary control inputs, a source coupled to a first power supply and a drain coupled to a first common node also coupled to a drain of the series transistor, a first inductor including a first lead coupled to the first common node a second lead coupled to a second common node and a second shunt transistor including a gate coupled to the another of the complementary control inputs, a source coupled to the second common node and a drain coupled to a second power supply, wherein the second common node comprises an output of the switch.

The first and second couplers desirably but not essentially each comprise a rat race hybrids.

Alternatively, the first and second couplers desirably but not essentially each comprise a first capacitor including a first lead coupled to the first port and a second lead coupled to the fourth port, a second capacitor including a first lead coupled to the first port and a second lead coupled to the second port, a first inductor including a first lead coupled to the third port and a second lead coupled to the fourth port, a third capacitor including a first lead coupled to the second port and a second lead coupled to the third port, a second inductor including a first lead coupled to the first port and a second lead coupled to ground and a third inductor including a first lead coupled to the second port and a second lead coupled to ground.

An apparatus for providing electronically tunable biphase modulation desirably comprises an input and a first switch including a first input coupled to the input, a first output and a second output. The first switch couples the first input to either the first output or to the second output in response to a modulating signal. The apparatus further comprises a first signal path including a first phase shift. The first signal path is coupled to the first output. The apparatus also includes a second signal path including a second phase shift different than the first phase shift. The second signal path is coupled to the second output. The apparatus also further includes a second switch including a first input coupled to the first signal path, a second input coupled to the second signal path and a terminal output. The second switch couples the first signal path to the terminal output when the first switch couples the input to the first signal path and couples the second signal path to the terminal output when the first switch couples the input to the second signal path. The first signal path comprises a first coupler including first, second, third and fourth ports. The first port is coupled to the first output of the first switch, the second port is coupled to a first reactance element, the third port is coupled to the first input of the second switch and the fourth port is coupled to a second reactance element. The second signal path comprises a second coupler including first, second, third and fourth ports. The first port of the second coupler is coupled to the second output of the first switch, the second port of the second coupler is coupled to a third reactance element, the third port of the second coupler is coupled to the second input of the second switch and the fourth port of the second coupler is coupled to a fourth reactance element.

The first and second couplers desirably but not essentially each comprise a first capacitor including a first lead coupled to the first port and a second lead coupled to the fourth port, a second capacitor including a first lead coupled to the first port and a second lead coupled to the second port, a first inductor including a first lead coupled to the third port and a second lead coupled to the fourth port, a third capacitor including a first lead coupled to the second port and a second lead coupled to the third port, a second inductor including a first lead coupled to the first port and a second lead coupled to ground and a third inductor including a first lead coupled to the second port and a second lead coupled to ground.

The first, second, third and fourth reactance elements each desirably but not essentially comprise varactor diodes including reactances responsive to low frequency control signals.

The first, second, third and fourth reactance elements desirably but not essentially include reactances responsive to low frequency control signals.

The first reactance element desirably but not essentially includes a phase shifter providing ninety degrees of phase shift between a first terminal and a second terminal, the first terminal coupled to the second port of the first coupler and a varactor diode including a reactance responsive to low frequency control signals, the varactor diode including a first lead coupled to the second terminal and a second lead coupled to ground.

DETAILED DESCRIPTION OF THE DRAWING

Figure 1:
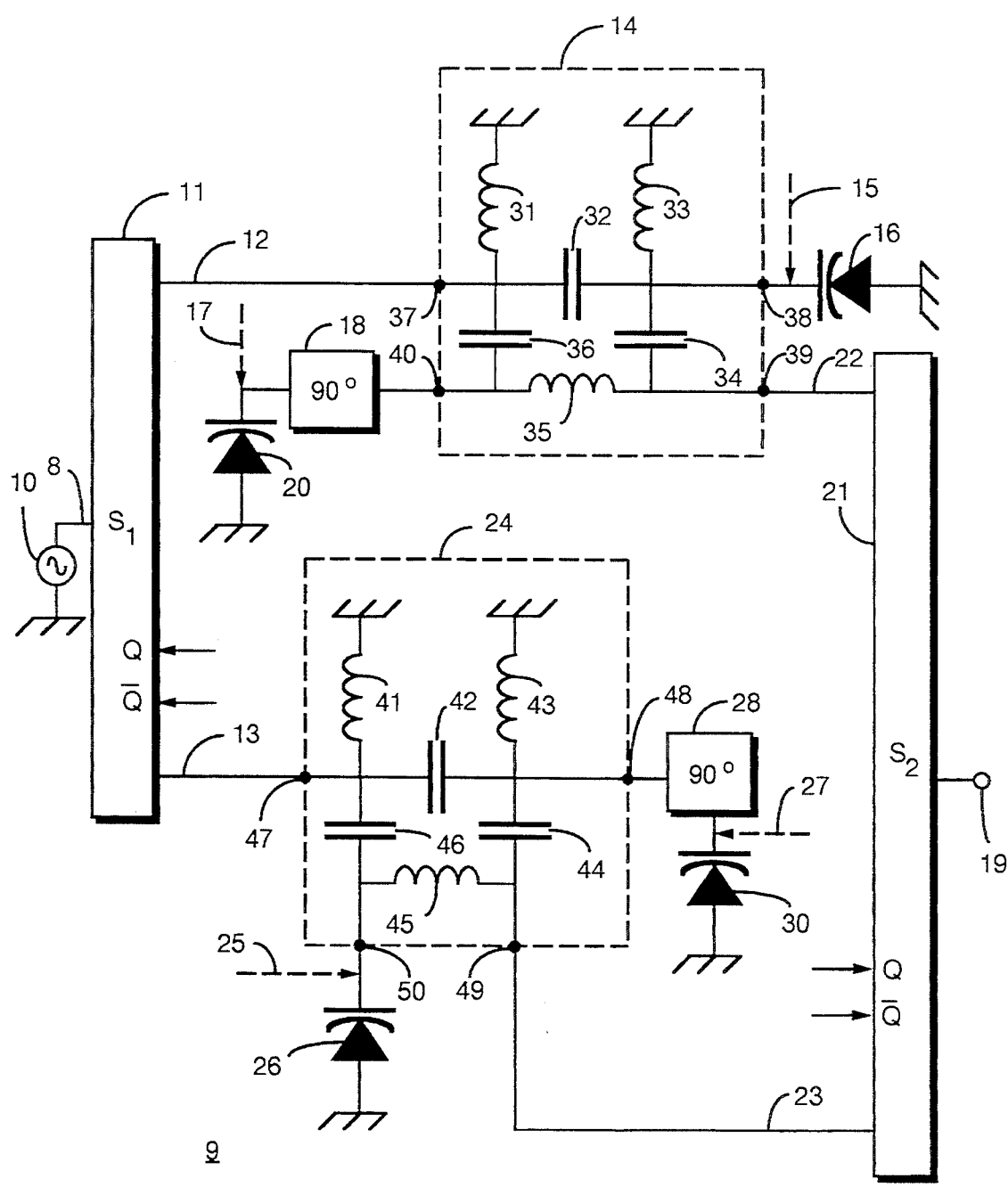
FIG. 1 is a simplified schematic diagram of a biphase modulator in accordance with the present invention.

FIG. 1 is a simplified schematic diagram of biphase modulator 9 in accordance with the present invention. Biphase modulator 9 usefully comprises single-pole double-throw (SPDT) input switch 11 ($S_1$) having an input coupled to signal source 10 for providing a signal to be modulated. Input switch 11 includes outputs 12, 13 coupled to first ports 37, 47 of couplers 14, 24, respectively.

Couplers 14, 24, also known as ring couplers, may be realized in lumped element form (as illustrated) or as rat race hybrids (i.e., employing transmission lines to effect phase shifts). Biphase modulator 9 also includes electronically variable reactance elements 16, 20, 26, 30 and phase shift networks 18, 28. Reactance element 16 is coupled to second port 38 of coupler 14, reactance element 20 is coupled to fourth port 40 of coupler 14 via 90° phase shift network 18, while reactance element 26 is coupled to fourth port 50 of coupler 24 and reactance element 30 is coupled to second port 48 of coupler 24 via 90° phase shift network 28. This antisymmetric arrangement (i.e., reversing the roles of second 38, 48 and fourth 40, 50 ports of couplers 14, 24, respectively) provides signals at third ports 39, 49 having a nominal 180° degree phase difference when reactance elements 16, 20, 26, 30 all have identical impedances.

Applicants have discovered that significant advantages accrue when biphase modulator 9 is implemented using couplers 14, 24 realized in monolithic form and requiring fewer elements than prior art four port couplers as exemplified in U.S. Pat. No. 5,175,517, entitled "Lumped Element Realization of Ring Hybrids Including $\pi$ Circuit And Tank Circuit Means," issued to M. Dydyk, R. Keilmeyer and J. Lauchner on Dec. 29, 1992, which is hereby incorporated herein by reference. Further, components comprising 90° phase shift networks 18, 28 may be subsumed within or combined with components comprising couplers 14, 24, respectively, providing reduced element count, promoting higher yields when fabricated in monolithic form and simplifying design, layout and analysis of biphase modulator 9.

Output switch 21 ($S_2$) is usefully an SPDT switch and includes input 22 coupled to third port 39 of coupler 14, input 23 coupled to third port 49 of coupler 24 and output 19 for providing modulated output signals.

Input switch 11 and output switch 12 are electronically toggled in synchronism (i.e., collectively function as a double-pole, double-throw switch) to select either a first signal path comprising coupler 14 and associated phase shift elements 16, 18, 20 or a second signal path comprising coupler 24 and associated phase shift elements 26, 28, 30. The first and second signal paths include different phase shifts selected through electronic adjustment of electronically variable reactance elements 16, 20, 26, 30, represented in FIG. 1 as varactor diodes.

Figure 2:
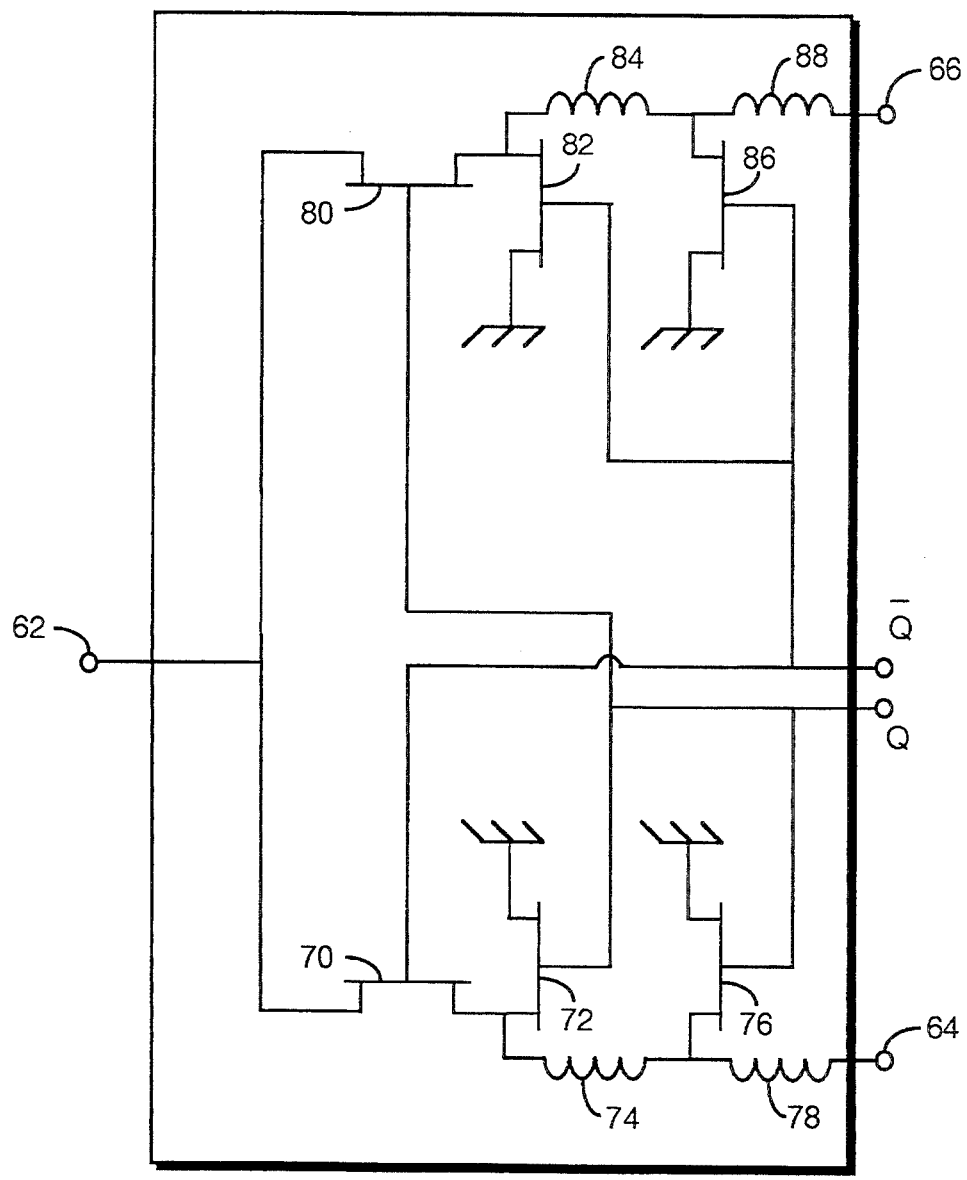
FIG. 2 is a schematic diagram of an embodiment of the switches of FIG. 1.

In one embodiment, each of switches 11, 21 comprises a pair of series-shunt-shunt switches. Referring now to FIGS. 1 and 2, each series-shunt-shunt switch desirably comprises a series transistor 70 (or 80) having a gate coupled to one of the complementary control inputs and a source coupled to input 62 (analogous to port 8 or 19, FIG. 1) and first shunt transistor 72 (or 82) having a gate coupled to another of said complementary control inputs, a source coupled to a first power supply (e.g., ground as illustrated) and a drain coupled to a first common node also coupled to a drain of said series transistor. First inductor 74 (or 84) includes a first lead coupled to the first common node and a second lead coupled to a second common node. Second shunt transistor 76 (or 86) includes a gate coupled to the another of the complementary control inputs, a source coupled to said second common node and a drain coupled to a second power supply (e.g., ground as illustrated), wherein the second common node comprises an output of switch 60. It will be appreciated from inspection of FIG. 2 that when the first control signal (e.g., Q) enables the first series transistor 70 (i.e., switches first series FET to a conductive state), the complement to the first control signal (e.g., $\overline{Q}$) renders first series FET 80 nonenabled, i.e., nonconductive. In this state, FETs 82, 86 are rendered conductive, i.e., shunt any signals present at FET 80 to ground while FETs 72, 76 are in a nonconductive state, i.e., do not shunt signals to ground. Thus, in this state, signals present at port 62 are coupled to port 64 (and vice versa; signals present at port 64 are coupled to port 62) and port 66 is effectively decoupled from port 62. In the other state, signals present at port 62 are coupled to port 66 and vice versa while port 64 is effectively decoupled from port 62. Inductors 74, 76, 84, 86 desirably compensate for parasitic capacitances present in switch 60 as realized in practice.

It will be appreciated that other electronically alterable phase shift elements (e.g., FETs etc.) may be employed for electronically variable reactance elements 16, 20, 26, 30. In the general case, electronically variable reactance elements 16, 20, 26, 30 include DC bias networks (not illustrated), represented as dashed lanes 15, 17, 25, 27, respectively, for effecting electronic adjustment of the net phase shifts of the first and second signal paths over a first frequency range via independent adjustment of each of the reactances of electronically variable reactance elements 16, 20, 26, 30 in response to low frequency control signals coupled to electronically variable reactance elements 16, 20, 26, 30 via DC bias networks 15, 17, 25, 27, respectively. Typically, the low frequency signals alter the degree of reverse bias of varactor diodes 16, 20, 26, 30, thereby modulating the capacitance and hence the reactance thereof. Input switch 11 and output switch 12 are usefully realized as FET switching circuits, desirably as a high input-output isolation switch and preferably as a "series-shunt-shunt" switch.

Series-shunt-shunt switches employ a series FET toggled by a (modulating) signal Q coupled to a gate of the series FET. The series FET has a source (or drain) coupled to a switch input (e.g., to signal source 10) and a drain (or source) coupled to a first node. A first shunt FET has a drain coupled to the first node and has a source coupled to a power supply. A first inductor has a first lead coupled to the first node and a second lead coupled to a second node. A second shunt FET has a drain coupled to the second node and a source coupled to a power supply. A second inductor has a first lead coupled to the second node and a second lead coupled to an output (e.g., output 12). A first toggling signal Q is coupled to a gate of the series FET and a second toggling signal $\overline{Q}$ (i.e., the complement of Q) is coupled to gates of the first and second shunt FETs. A similar series-shunt-shunt circuit coupled to the other switch output and having Q, $\overline{Q}$ interchanged (relative to the first series-shunt-shunt arrangement) provides the other half of SPDT switches 11, 21. All FETs desirably include isolation resistors in series with the gates and having values of circa two k$\Omega$. Typically, Q, $\overline{Q}$ vary between 0 and $-3$ volts when the FETs comprising switches 11, 21 are realized as GaAs MESFETs in a monolithic implementation of biphase modulator 9.

These types of switches provide high isolation in the "off" state because the high impedance of the series FET reduces the output current induced by the input signal and the low impedance of the first and second shunt FETs in the switch "off" state shunt the reduced output current to ground. In the "on" state, the high impedances of the first and second shunt FETs do not shunt the output current to ground and the low impedance of the series FET couples the input signal to the output.

Couplers 14, 24 usefully comprise ring couplers and may be realized as transmission line (distributed) circuits known as rat race couplers, lumped element circuits (as illustrated) or in any other convenient form providing one-fourth of a wavelength phase shift (i.e., 90° at the nominal center frequency) between three adjacent pairs of ports and three-fourths of a wavelength phase shift (i.e., 270°) between the remaining two adjacent ports (i.e., across inductors 35, 45).

Phase shift networks 18, 28 may be realized as lumped-element circuits or in other forms as desired for a particular design. In practice, couplers 14, 24 and/or phase shift networks 18, 28 may include additional circuit elements or their functions and values for lumped-element equivalents (or other functional building blocks, e.g., transmission line lengths and/or geometries) are usually derived through use of optimization algorithms implemented in microwave design programs such as LIBRA, available from EEsof of Westlake Village, Calif.

Monolithic implementation of biphase modulator 9 (e.g., as a GaAs monolithic microwave integrated circuit or MMIC) avoids having to select reactance elements 16, 20, 26, 30 having matched properties because monolithically realized circuits tend to provide elements having properties that are all affected in the same way by some types of manufacturing variations. Use of lumped element ring couplers for couplers 14, 24 provides good input and output impedance matching over the desired bandwidth for all bias values for electronically variable reactance elements 16, 20, 26, 30 and interchanging the roles of ports 38, 40 with respect to ports 48, 50 including phase shift networks 18, 28 eliminates need for a 180° phase shift in combining the signals from the first and second signal paths. Use of electronically variable reactance elements 16, 20, 26, 30 allows analog adjustment of modulation angle not possible with other types of biphase modulators such as digital phase shifters.

EXAMPLE A modulator was monolithically implemented employing lumped-element equivalent values as given in Table I below through the foundry services of TriQuint Semiconductor.

TABLE I

Element values for the tunable biphase modulator.

| ELEMENT | VALUE |
| --- | --- |
| 31 | 1.0 nH |
| 32 | 0.46 pF |
| 33 | 0.69 nH |
| 34 | 0.55 pF |
| 35 | 1.84 nH |
| 36 | 0.33 pF |
| 41 | 1.0 nH |
| 42 | 0.31 pF |
| 43 | 0.88 nH |
| 44 | 0.38 pF |
| 45 | 1.9 nH |
| 46 | 0.42 pF |

This modulator provides roughly sixty degrees of tuning range via biases applied to reactance elements 16, 20, 26, 30, realized as varactor diodes. In the test circuit, DC bias networks 25, 27, corresponding to reactance elements 26, 30, were grounded and DC bias networks 15, 17 were fed by a common control line having a control signal voltage of 0 to −2 volts. This modulator employed GaAs MESFET switches (in the series-shunt-shunt configuration described supra) for first and second switches 11, 21. Channel widths of 250 micrometers and 150 micrometers were employed for the series and shunt FETs, respectively, and 0.3 nH inductors couple the switch sections together.

The exemplary modulator maintains a measured 0.5 dB amplitude balance between the first and second signal path signals over a 10% fractional bandwidth when the first and second signal paths are set, through DC signals directed to electronically variable reactance elements 16, 20, 26, 30 via DC bias networks 15, 17, 25, 27, to maintain a phase difference between the first and second paths of 172 degrees. The component values provided in Table I were chosen to accommodate impedance variations of electronically variable reactance elements 16, 20, 26, 30 with bias while maintaining the close amplitude balance desired for biphase modulator 9.

This example provides roughly 60 degrees of phase shift change when the control voltage coupled to one pair of variable reactance elements 16, 20 and 26, 30 is varied over the range 0 to −2 volts. Thus, tunable biphase modulator 9 has been described which overcomes specific problems and accomplishes certain advantages relative to prior art methods and mechanisms. The improvements over known technology are significant. This invention provides the high speed (<100 nanoseconds switching speed) of traditional digital phase shift modulators with the phase accuracy of an analog phase shift modulator. The expense, complexities and high parts count of modulators assembled from discrete components are avoided. Similarly, fabrication in monolithic form facilitates achieving balanced structures required to provide close control of the phase difference and the amplitude balance in the modulated signal, while simultaneously providing small form factor, light weight and robust circuitry. A particular advantage of the structure of the instant application when implemented monolithically (i.e., as an MMIC) is that the symmetry of the two signal paths causes both signal paths to be similarly affected by process variations, preserving the phase difference obtained between the two paths and rendering this design less susceptible to performance degradation in light of process variations.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. An apparatus for providing electronically tunable biphase modulation, said apparatus comprising:
   an input;
   a first switch having a first input coupled to said input, a first output and a second output, said first switch coupling said first input to either said first output or to said second output in response to a modulating signal;
   a first signal path having a first phase shift, said first signal path coupled to said first output;
   a second signal path having a second phase shit different than said first phase shift, said second signal path coupled to said second output; and
   a second switch having a first input coupled to said first signal path, a second input coupled to said second signal path and a terminal output, said second switch coupling said first signal path to said terminal output when said first switch couples said input to said first signal path and coupling said second signal path to said terminal output when said first switch couples said input to said second signal path.

2. An apparatus as claimed in claim 1, wherein said first signal path comprises a first coupler having first, second, third and fourth ports, said first port coupled to said first output of said first switch, said second port coupled to a first reactance element, said third port coupled to said first input of said second switch and said fourth port coupled to a second reactance element.

3. An apparatus as claimed in claim 2, wherein said second signal path comprises a second coupler having first, second, third and fourth ports, said first port of said second coupler coupled to said second output of said first switch, said second port of said second coupler coupled to a third reactance element, said third port of said second coupler coupled to said second input of said second switch and said fourth port of said second coupler to a fourth reactance element.

4. An apparatus as claimed in claim 3, wherein a phase shift between said first and fourth ports of said first and second couplers is three times a first phase shift between any two other adjacent ports.

5. An apparatus as claimed in clam 4, wherein said first phase shift is ninety degrees.

6. An apparatus as claimed in claim 2, wherein said first couples comprises:
   a first capacitor having a first lead coupled to said first port and a second lead coupled to said fourth port;
   a second capacitor having a first lead coupled to said first port and a second lead coupled to said second port;
   a first inductor having a first lead coupled to said second port and a second lead coupled to said third port;
   a third capacitor having a first lead coupled to said third port and a fourth lead coupled to said fourth port;
   a second inductor having a first lead coupled to said first port and a second lead coupled to ground; and
   a third inductor having a first lead coupled to said fourth port and a second lead coupled to the ground.

7. An apparatus as claimed in claim 3, wherein said first, second, third and fourth reactance elements have reactances responsive to low frequency control signals.

8. An apparatus as claimed in claim 3, wherein said first, second, third and fourth reactance elements each comprise varactor diodes having reactances responsive to low frequency control signals.

9. An apparatus as claimed in claim 7, wherein said first reactance element includes:
   a phase shifter providing ninety degrees of phase shift between a first terminal and a second terminal, said first terminal coupled to said second port of said first coupler; and
   a varactor diode having a reactance responsive to low frequency control signals, said varactor diode having a first lead coupled to said second terminal and a second lead coupled to ground.

10. An apparatus as claimed in claim 9, wherein said apparatus comprises a monolithic microwave integrated circuit.

11. An apparatus as claimed in claim 1, wherein said first and second switches are electronic switches operating in response to a modulation signal.

12. An apparatus as claimed in claim 10, wherein said first switch comprises a pair of series-shunt-shunt switches each having a signal input, a pair of complementary control inputs and output, wherein said inputs of said pair of series-shunt-shunt switches are coupled to said input, an output of a first of said pair is coupled to said first signal path and an output of a second of said pair is coupled to said second signal path.

13. An apparatus as claimed in claim 12, wherein each of said pair of series-shunt-switches comprises:
   a series transistor having a gate coupled to one of said complementary control inputs and a source coupled to said input;
   a first shunt transistor having a gate coupled to another of said complementary control inputs, a source coupled to a first power supply and a drain coupled to a first common node also coupled to a drain of said series transistor;
   a first inductor having a first lead coupled to said first common node and a second lead coupled to a second common node; and
   a second shunt transistor having a gate coupled to said another of said complementary control inputs, a source coupled to said second common node and a drain coupled to a second power supply, wherein said second common node comprises an output of said switch.

14. An apparatus as claimed in claim 3, wherein said first and second couplers each comprise a rat race hybrids.

15. An apparatus as claimed in claim 3, wherein said first and second couplers each comprise impedance transforming ring hybrid circuits, wherein said first and third ports are adapted to impedance match to a characteristic impedance having a first magnitude when said second and fourth ports are coupled to elements providing a different impedance, said different impedance having a magnitude different than said magnitude of said characteristic impedance.

16. An apparatus for providing electronically tunable biphase modulation, said apparatus comprising:
   an input;
   a first switch having a first input coupled to said input, a first output and a second output, said first switch coupling said first input to either said first output or to said second output in response to a modulating signal;
   a first signal path having a first phase shift, said first signal path coupled to said first output;
   a second signal path having a second phase shift different than said first phase shift, said second signal path coupled to said second output;
   a second switch having a first input coupled to said first signal path, a second input coupled to said second signal path and a terminal output, said second switch coupling said first signal path to said terminal output when said first switch couples said input to said first signal path and coupling said second signal path to said terminal output when said first switch couples said input to said second signal path;
   wherein said first signal path comprises a first coupler having first, second, third and fourth ports, said first port coupled to said first output of said first switch, said second port coupled to a first reactance element, said third port coupled to said first input of said second switch and said fourth port coupled to a second reactance element; and
   wherein said second signal comprises a second coupler having first, second, third and fourth ports, said first port of said second coupler coupled to said second output of said first switch, said second port of said second coupler coupled to a third reactance element, said third port of said second coupler coupled to said second input of said second switch and said fourth port of said second coupler coupled to a fourth reactance element.

17. An apparatus as claimed in claim 16, wherein said first and second couplers each comprise impedance transforming ring hybrid circuits, wherein said first and third ports are adapted to impedance match to a characteristic impedance having a first magnitude when said second and fourth ports are coupled to elements providing a different impedance, said different impedance having a magnitude different than said magnitude of said characteristic impedance.

18. An apparatus as claimed in claim 17, wherein said first, second, third and fourth reactance elements each comprise varactor diodes having reactances responsive to low frequency control signals.

19. An apparatus as claimed in claim 17, wherein said first, second, third and fourth reactance elements have reactances responsive to low frequency control signals.

20. An apparatus as claimed in claim 19, wherein said first reactance element includes:

a phase shifter providing ninety degrees of phase shift between a first terminal and a second terminal, said first terminal coupled to said second port of said first coupler; and a varactor diode having a reactance responsive to low frequency control signals, said varactor diode having a first lead coupled to said second terminal and a second lead coupled to ground.

* * * * *